(12) United States Patent
Forrest et al.

(10) Patent No.: US 10,778,141 B2
(45) Date of Patent: Sep. 15, 2020

(54) DEVICE AND METHOD OF MONOLITHIC INTEGRATION OF MICROINVERTERS ON SOLAR CELLS

(71) Applicant: THE REGENTS OF THE UNIVERSITY OF MICHIGAN, Ann Arbor, MI (US)

(72) Inventors: Stephen R. Forrest, Ann Arbor, MI (US); Kyusang Lee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 31 days.

(21) Appl. No.: 15/534,504

(22) PCT Filed: Dec. 11, 2015

(86) PCT No.: PCT/US2015/065167
§ 371 (c)(1),
(2) Date: Jun. 9, 2017

(87) PCT Pub. No.: WO2016/094757
PCT Pub. Date: Jun. 16, 2016

(65) Prior Publication Data
US 2017/0366135 A1 Dec. 21, 2017

Related U.S. Application Data

(60) Provisional application No. 62/090,661, filed on Dec. 11, 2014.

(51) Int. Cl.
*H02S 40/32* (2014.01)
*H01L 31/18* (2006.01)
*H01L 31/0735* (2012.01)
(Continued)

(52) U.S. Cl.
CPC .......... *H02S 40/32* (2014.12); *H01L 31/0693* (2013.01); *H01L 31/0735* (2013.01);
(Continued)

(58) Field of Classification Search
CPC . H02S 40/32; H01L 31/1896; H01L 31/0693; H01L 31/184; H01L 31/0735; H01L 31/1844
See application file for complete search history.

(56) References Cited

U.S. PATENT DOCUMENTS 4,217,633 A 8/1980 Evans, Jr.
2012/0260969 A1 10/2012 Willis et al.
(Continued)

FOREIGN PATENT DOCUMENTS

WO WO-2013/075144 A1 5/2013

OTHER PUBLICATIONS

Lidow, "GaN as a Displacement Technology for Silicon in Power Management", IEEE 2011.*
International Search Report & Written Opinion dated Mar. 21, 2016, PCT/US2015/065167.
Ferguson et al., "Contact Adhesion of Thin Gold Films on Elastomeric Supports: Cold Welding Under Ambient Conditions," Science, vol. 253, No. 5021, pp. 776-778 (1991).
(Continued)

*Primary Examiner* — Matthew T Martin
(74) *Attorney, Agent, or Firm* — Lempia Summerfield Katz LLC

(57) ABSTRACT

A method of fabricating a photovoltaic cell having a microinverter is provided. The method may include fabricating a monolithic microinverter layer through epitaxy and operably connecting the at least one microinverter layer to at least one photovoltaic cell formed on a photovoltaic layer. A photovoltaic device is also provided. The device may have a photovoltaic layer comprising at least one photovoltaic cell and a microinverter layer comprising at least one microinverter, wherein the microinverter layer was fabricated through epitaxy, the at least one microinverter is configured to be operably connected to at least one photovoltaic cell.

19 Claims, 4 Drawing Sheets

(51) Int. Cl.
 H01L 31/0693 (2012.01)
(52) U.S. Cl.
 CPC ........ *H01L 31/184* (2013.01); *H01L 31/1844* (2013.01); *H01L 31/1896* (2013.01); *Y02E 10/544* (2013.01)

(56) References Cited

U.S. PATENT DOCUMENTS

2013/0001731 A1* 1/2013 Forrest ................ H01L 27/1446 257/443
2014/0371931 A1* 12/2014 Lin ......................... H02S 10/00 700/287

OTHER PUBLICATIONS

Kim et al., "Micropatterning of Organic Electronic Devices by Cold-Welding," Science, vol. 288, No. 5467, pp. 831-833 (2000).
Lee et al., "Multiple growths of epitaxial lift-off solar cells from a single InP substrate," Appl. Phys. Lett., vol. 97, pp. 101107-1 to 101107-3 (2010).
Yablonovitch et al., "Extreme selectivity in the lift-off of epitaxial GaAs films," Appl. Phys. Lett., vol. 51, No. 26, pp. 2222-2224 (1987).
Yoon et al., "GaAs photovoltaics and optoelectronics using releasable multilayer epitaxial assemblies," Nature, vol. 465, pp. 329-333 (2010).

* cited by examiner

DEVICE AND METHOD OF MONOLITHIC INTEGRATION OF MICROINVERTERS ON SOLAR CELLS

This application claims the benefit of priority of U.S. Provisional Patent Application No. 62/090,661, filed Dec. 11, 2014, which is incorporated herein by reference in its entirety.

The present disclosure is directed to monolithic microinverter devices and methods of fabricating, and more particularly, monolithic microinverter devices for photovoltaic cells.

Photovoltaic cells generate a direct current (DC) output; therefore, DC-AC inverters are generally needed to convert the DC output into a utility frequency alternating current (AC) which can be fed into a commercial AC electrical grid or AC off-grid electrical systems. The inverter is usually a primary component in a photovoltaic panel and also usually makes up a considerable portion of the balance of system (BOS) cost. Some photovoltaic panels have an array of solar cells that use a single common inverter to convert the current from DC to AC. One disadvantage for this configuration is that an array of solar cells using a single inverter operates at lower power generation in shaded conditions even if the entire array is not shaded. The use of more than one inverter has been pursued, but installation costs and other concerns associated with redundant components in the solar cell have limited this option.

In one aspect, the present disclosure is directed to a method of fabricating a photovoltaic cell having a microinverter. The method may include fabricating a monolithic microinverter layer through epitaxy and operably connecting the at least one microinverter layer to at least one photovoltaic cell formed on a photovoltaic layer.

In some embodiments, the method may further include depositing an insulating layer between the photovoltaic layer and the microinverter layer. In some embodiments, the microinverter layer may include a layer of transistors chosen from high electron mobility transistors, metal semiconductor field effect transistors, junction field effect transistors, and heterojunction bipolar transistors. In some embodiments, the microinverter layer may further include an H-bridge DC/AC inverter circuit. In some embodiments, the photovoltaic layer may include III V semiconductors. In some embodiments, the method may be applied to substrate based devices. In some embodiments, the method may be applied to thin film based devices. In some embodiments, a growth order may be normal and may be combined with transfer printing techniques.

In some embodiments, fabricating the microinverter layer through epitaxy may include depositing at least one sacrificial layer on a growth substrate, depositing the microinverter layer on the at least one sacrificial layer, depositing at least one insulator layer on the at least one microinverter layer, and etching the sacrificial layer with one or more etch steps that remove at least the photovoltaic layer from the growth substrate to form integrated thin film solar cells.

In some embodiments, operably connecting the at least one microinverter layer to at least one photovoltaic cell formed on a photovoltaic layer may include depositing a photovoltaic layer on the at least one insulator layer and forming a patterned metal layer on the photovoltaic layer by a photolithography method. In some embodiments, the photovoltaic layer may be inverted. In some embodiments, the method may further include cold weld bonding the photovoltaic cell to a metallized surface of a substrate.

In another aspect, the present disclosure is directed to a photovoltaic device. The device may include a photovoltaic layer and a microinverter layer.

In some embodiments, the photovoltaic layer may include at least one photovoltaic cell. In some embodiments, the microinverter layer may include at least one microinverter. In some embodiments, the microinverter layer may be fabricated through epitaxy. In some embodiments, the at least one microinverter is configured to be operably connected to at least one photovoltaic cell. In some embodiments, such a photovoltaic device may further include an insulating layer between the photovoltaic layer and microinverter layer.

In some embodiments, the microinverter layer may include a layer of transistors chosen from high electron mobility transistors, metal semiconductor field effect transistors, junction field effect transistors, and heterojunction bipolar transistors. In some embodiments, the microinverter layer may further include an H-bridge DC/AC inverter circuit. In some embodiments, the photovoltaic layer may include III V semiconductors. In some embodiments, the photovoltaic device may be a substrate based device. In some embodiments, the photovoltaic device may be a thin film based device. In some embodiments, the photovoltaic cell may be cold weld bonded to a metallized surface of a substrate.

The present disclosure is directed to monolithic microinverter devices and methods of fabricating, and more particularly, monolithic microinverter devices for photovoltaic cells. The term monolithic as used herein may describe systems or devices wherein the functionally distinguishable aspects are not separate components by design, rather the functionally distinguishable aspects are configured to be integrated components. Herein the terms photovoltaic layer and solar cell are used interchangeably.

Figure 1A:
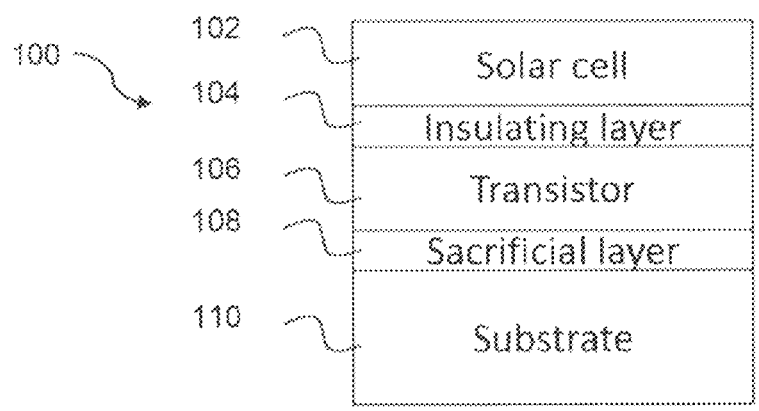
FIG. 1A is a schematic illustration of a generalized structure for epitaxial growth, according to an exemplary embodiment.
Figure 1B:
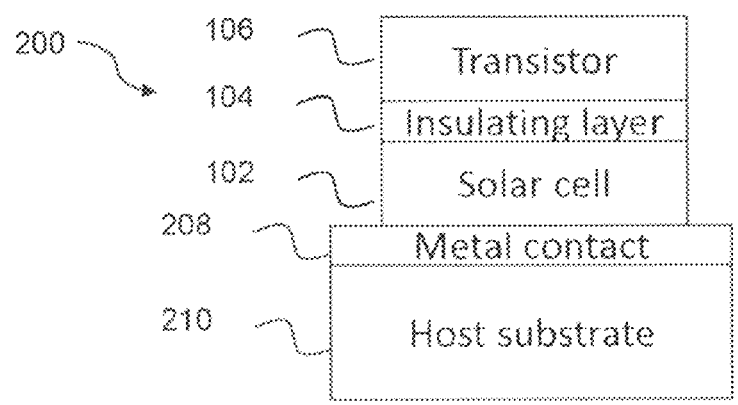
FIG. 1B is a schematic illustration of the transferred active device layers of FIG. 1A onto a host substrate, according to an exemplary embodiment.

FIGS. 1A and 1B show an exemplary embodiment of the fabrication method. FIG. 1A shows a schematic of a growth structure 100. To integrate a DC/AC inverter with thin-film solar cells on a host substrate using an epitaxial lift-off (ELO) process, an inverted (as opposed to a normal growth order) photovoltaic structure can be grown on the wafer (GaAs or InP) using epitaxial growth. For reference, an ELO process is described by Yabionovitch et al. in Extreme selectivity in the lift-off of epitaxial GaAs films (Yablonovitch, E., Gmitter, T., Harbison, J. P. & Bhat, R. Extreme selectivity in the lift-off of epitaxial GaAs films. *Appl. Phys. Len.* 51, 2222 (1987). In an inverted solar cell, the photo-excited charges flow through the device in the opposite direction as in a normal device because the positive and negative electrodes are reversed relative to the direction of photoexcitation. In some embodiments the normal growth order can be employed and further combined with an additional transferring process, such as transfer printing method. A transfer printing method, for reference, is described by Yoon et al. in GaAs photovoltaics and optoelectronics using releasable multilayer epitaxial assemblies (Yoon, J., Jo, S., Chun, I. S., Jung, I., Kim, H.-S., Meitl, M., Menard, E., Li. X, Coleman, J. J, Paik, U. & Rogers, J. A. GaAs photovoltaics and optoelectronics using releasable multilayer epitaxial assemblies. Nature 465, 329-333 (2010)). In some embodiments, un-doped wide-bandgap semiconductor materials (such as InGaP, AlGanIP and AlGaAs) can be inserted between transistor and solar cell epi-layers to electrically isolate the solar cells and transistors active layers. In some embodiments the transistor structure can be chosen from high electron mobility transistors (HEMTs), metal semiconductor field effect transistors (MESFETs), junction field effect transistors (JFETs) and heterojunction bipolar transistors (JBTs).

Growth structure 100 may be grown in an inverted growth order and may be configured to undergo an ELO process. In this particular embodiment, which is configured to undergo the ELO process, a sacrificial layer 108 is grown on a substrate 110. The following layers may be deposited above the sacrificial layer 108: a transistor layer 106, an insulating layer 104 and a solar cell layer 102. The order of layers 102-106 in this embodiment represent an inverted growth structure so the solar cell layer may be deposited last, which allows for etching of the sacrificial layer, turning over the device architecture, and placing the transistor layer atop the solar cell layer.

FIG. 1B shows an exemplary embodiment of a device structure 200, transferred from the parent wafer, on a host substrate after the completion of an ELO process. According to this embodiment, the device structure 200 may include transistor layer 106, insulating layer 104, and solar cell layer 102, which may be fabricated through the process described herein with reference to FIG. 1A. Layers 102-106 fabricated as shown in FIG. 1A, may be operably connected to a host substrate 210, through a metal contact 208, as shown in FIG. 1B. To bond the sample to the host substrate, cold-weld bonding can be employed. For reference, cold-weld bonding is described by Lee et al. in Multiple growths of epitaxial lift-off solar cells from a single InP substrate (Lee, K., Shiu, K.-T., Zimmerman, J. D., Renshaw, C. K. & Forrest, S. R. Multiple growths of epitaxial lift-off solar cells from a single InP substrate. Appl. Phys. Lett. 97, 101107 (2010)). For reference, cold-weld bonding is further described by Kim et al. in "Micropatterning of organic electronic devices by cold-welding" (Kim, C., Burrows, P. & Forrest, S. Micropatterning of organic electronic devices by cold-welding. Science 288, 831-3 (2000)). For reference, cold-weld bonding is further described by Ferguson et al. in Contact adhesion of thin gold films on elastomeric supports: cold welding under ambient conditions (Ferguson, G. S., Chaudhury, M. K., Sigal, G. B. & Whitesides, G. M. Contact adhesion of thin gold films on elastomeric supports: cold welding under ambient conditions. Science 253, 776-778 (1991)). For the cold-welding process, the surfaces of the epi-layer and the host substrate are pre-coated with layers of a similar noble metal (Au, Ni etc.), then appropriate pressure is applied between two metal interfaces. Once the GaAs substrate is bonded to the plastic substrate, the active device region is lifted-off from the parent wafer by immersion in hydrofluoric acid. After the bonding and the ELO process, the structure may be inverted, leaving the transistor layers on top. The transistor layer, which may also be referred to as the transistor mesa may then be etched, and metal interconnects may be deposited.

Figure 2:
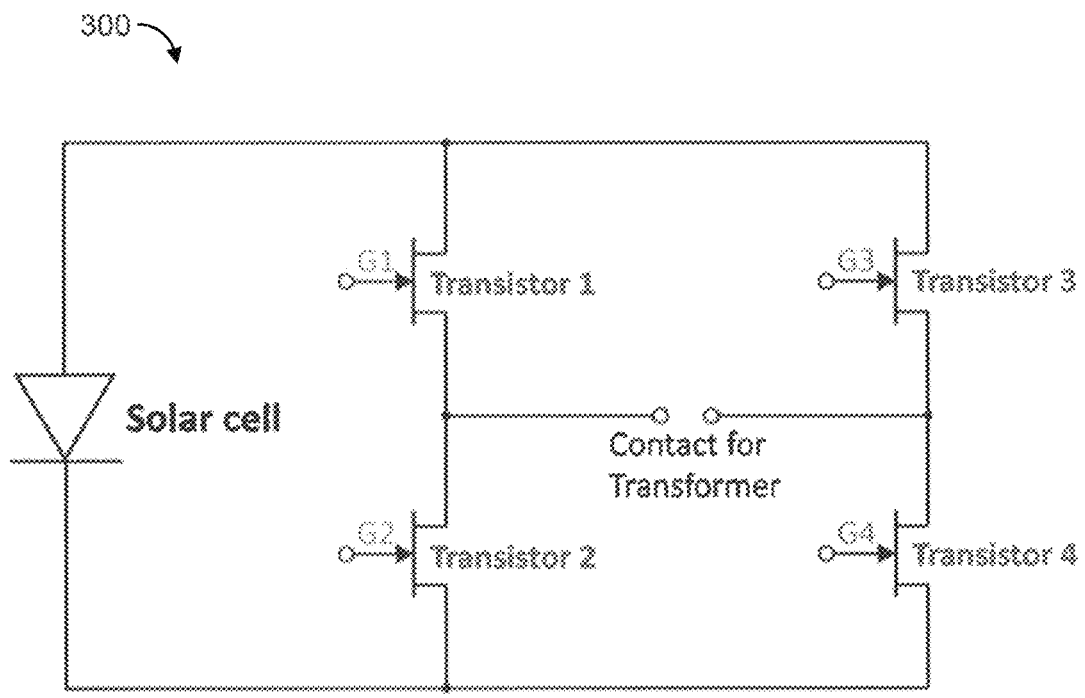
FIG. 2 is a schematic of an H-bridge DC/AC inverter circuit plus solar cell array, according to an exemplary embodiment.

FIG. 2 shows a schematic of an exemplary embodiment wherein a H-bridge DC/AC inverter circuit 300 may be integrated with solar cells. In this embodiment DC/AC inversion can be achieved, in some embodiments further using an external transformer, by switching contacts G1/G4 and the associated transistors T1/T4, on/off while switching G2/G3 off/on.

Figure 3:
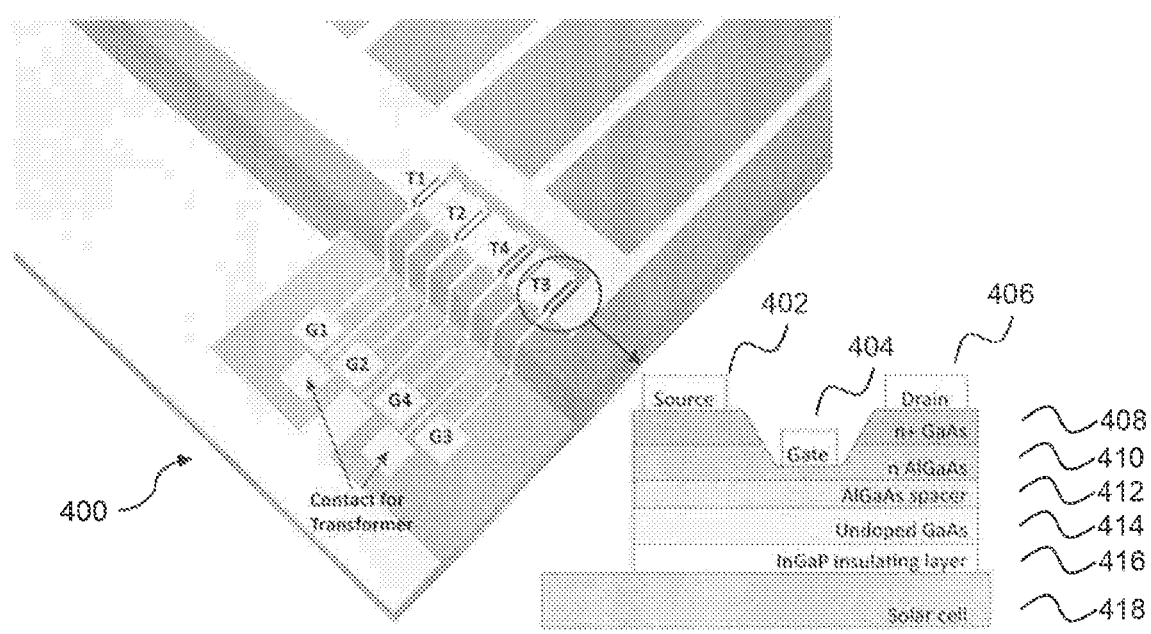
FIG. 3 is a monolithic integration schematic of a GaAs HEMT transistor plus solar cell cold-weld bonded to a flexible substrate, according to an exemplary embodiment.
Figure 4A:
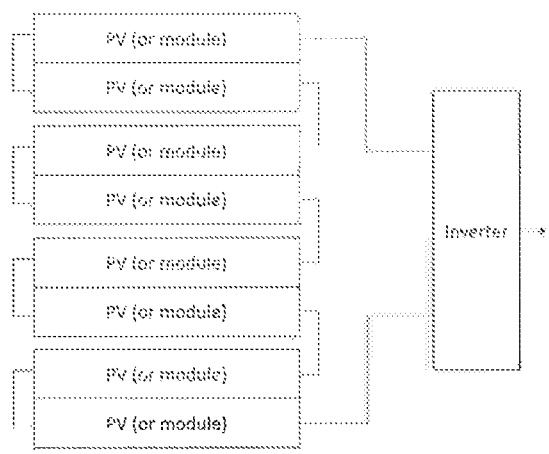
FIG. 4A is a schematic illustration of a solar power system with a large number of panels connected to a single inverter.
Figure 4B:
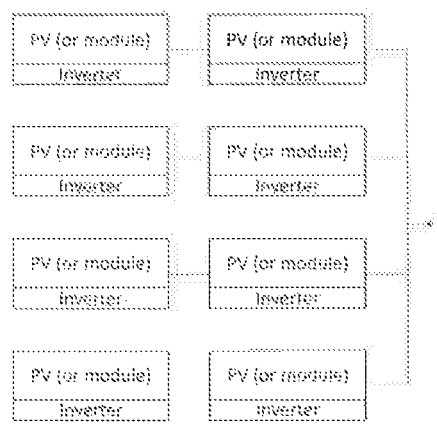
FIG. 4B is a schematic illustration of a solar power system where each solar cell or module incorporates its own inverters, according to an exemplary embodiment.

FIG. 3 shows a schematic of a H-bridge DC/AC inverter circuit 400 according to an exemplary embodiment. According to this embodiment, the contacts G1-G4 and transistors T1-T4 in FIG. 3 correspond to the schematic of FIG. 2. As shown in FIG. 3, the H-bridge DC/AC inverter circuit may be monolithically integrated on top of thin-film solar cells 418 where the H-bridge DC/AC inverter circuit comprises a thin-film HEMT structure (T1-T4, 402-414), which may include a source 402, a gate 404, a drain 406, a n+ GaAs layer 408, a n AlGaAs layer 410, a AlGaAs spacer layer 412, and an undoped GaAs layer 414. In this exemplary embodiment, the H-bridge DC/AC inverter circuit 400 may be grown on top of the solar cell active layer 418 and wide-bandgap isolation layer 416. Due to the fact that the area of the microinverter layer is toughly $10^{-4}$ times smaller than the solar cells, the loss of active area in this exemplary embodiment may be negligible. In some embodiments, an integrated microinverter on each solar cell may allow for the parallel connection of individual cells in a modular way, for example, as shown in FIG. 4B. This may provide enhanced power generation especially under the shaded condition compared with the photovoltaic system using a single inverter, for example, as shown in FIG. 4A. In some embodiments, the microinverter embedded with a power optimizer provides a maximum power point tracking functionality by pinpointing individual cell's ideal voltage and producing at its maximum power.

The disclosed method and devices are not limited to integrating of H-bridge inverter, but also can employ monolithic integration of various inverter circuits and photovoltaic optimizer, such as maximum power point tracking circuit and real-time monitoring circuits. Additional circuits would be apparent to one of ordinary skill in the art.

In some embodiments, a single photovoltaic cell may be connected to a single microinverter. In some embodiments, several photovoltaic cells may be connected to a single microinverter. Further it will be apparent to those skilled in the art that various modifications and variations can be made to the disclosed method and devices. Other embodiments will be apparent to those skilled in the art from consideration of the specification and practice of the disclosed method. It is intended that the specification and examples be considered as exemplary only, with a true scope being indicated by the claims included with this specification and their equivalents The exemplary disclosed method may be applicable in fabricating solar devices. Photovoltaic cells generate a direct current (DC) output; therefore, DC-AC inverters are generally needed to convert the DC output into a utility frequency alternating current (AC) which can be fed into a commercial electrical grid or off-grid electrical systems. An inverter is an essential component in a photovoltaic panel, but at the same time, it takes a considerable portion of balance of system cost. Therefore, the integration of microinverters with photovoltaic cells provides a potential to reduce the cost of photovoltaic system. In addition, integrated microinverters on each solar cell may allow for the parallel connection of individual cells in a modular way thus providing enhanced power generation especially under the shaded conditions compared with the photovoltaic system using single inverter.

What is claimed is:

1. A method of fabricating at least one thin-film photovoltaic cell having an integrated microinverter, the method comprising:
    fabricating a monolithic microinverter layer through epitaxy; and
    operably connecting the microinverter layer to at least one thin-film photovoltaic cell formed on a photovoltaic layer;
    wherein fabricating the microinverter layer through epitaxy and operably connecting it to the at least one thin-film photovoltaic cell comprises:
    depositing a sacrificial layer on a growth substrate;
    depositing the microinverter layer on the sacrificial layer;
    depositing an insulator layer on the microinverter layer;
    depositing the photovoltaic layer on the insulator layer; and
    etching the sacrificial layer with one or more etch steps to remove the microinverter layer, the insulator layer, and the photovoltaic layer from the growth substrate.

2. The method of claim 1, wherein the microinverter layer comprises a layer of transistors chosen from high electron mobility transistors, metal semiconductor field effect transistors, junction field effect transistors, and heterojunction bipolar transistors.

3. The method of claim 2, wherein the microinverter layer further comprises an H-bridge DC/AC inverter circuit.

4. The method of claim 2, wherein the photovoltaic layer comprises III-V semiconductors.

5. The method of claim 1, wherein operably connecting the microinverter layer to the at least one thin-film photovoltaic cell further comprises
    forming a patterned metal layer on the photovoltaic layer by a photolithography method.

6. The method of claim 5, further comprising cold-weld bonding the photovoltaic layer having the at least one thin-film photovoltaic cell formed thereon to a metallized surface of a host substrate.

7. The method of claim 1, further comprising etching the microinverter layer to define at least one microinverter thereon.

8. The method of claim 1, wherein the method forms a single thin-film photovoltaic cell connected to a single integrated microinverter.

9. The method of claim 1, wherein the method forms two or more thin-film photovoltaic cells connected to a single integrated microinverter.

10. The method of claim 6, wherein the photovoltaic layer having the at least one thin-film photovoltaic cell formed thereon is cold-weld bonded to the metallized surface of the host substrate before etching the sacrificial layer.

11. A method of fabricating at least one thin-film photovoltaic cell having an integrated microinverter, the method comprising:
    fabricating a monolithic microinverter layer through epitaxy; and
    operably connecting the microinverter layer to at least one thin-film photovoltaic cell formed on a photovoltaic layer;
    wherein fabricating the microinverter layer through epitaxy and operably connecting it to the at least one thin-film photovoltaic cell comprises:
    depositing a sacrificial layer on a growth substrate;
    depositing the photovoltaic layer on the sacrificial layer;
    depositing an insulator layer on the photovoltaic layer;
    depositing the microinverter layer on the insulator layer; and
    etching the sacrificial layer with one or more etch steps to remove the microinverter layer, the insulator layer, and the photovoltaic layer from the growth substrate.

12. The method of claim 11, wherein the microinverter layer comprises a layer of transistors chosen from high electron mobility transistors, metal semiconductor field effect transistors, junction field effect transistors, and heterojunction bipolar transistors.

13. The method of claim 12, wherein the microinverter layer further comprises an H-bridge DC/AC inverter circuit.

14. The method of claim 12, wherein the photovoltaic layer comprises III-V semiconductors.

15. The method of claim 11, wherein operably connecting the microinverter layer to the at least one thin-film photovoltaic cell further comprises forming a patterned metal layer on the photovoltaic layer by a photolithography method after etching the sacrificial layer.

16. The method of claim 15, further comprising cold-weld bonding the photovoltaic layer having the at least one thin-film photovoltaic cell formed thereon to a metallized surface of a host substrate via a transfer-printing method.

17. The method of claim 11, further comprising etching the microinverter layer to define at least one microinverter thereon.

18. The method of claim 11, wherein the method forms a single thin-film photovoltaic cell connected to a single integrated microinverter.

19. The method of claim 11, wherein the method forms two or more thin-film photovoltaic cells connected to a single integrated microinverter.

* * * * *